United States Patent [19]
Carlson et al.

[11] Patent Number: 6,018,459
[45] Date of Patent: Jan. 25, 2000

[54] POROUS METAL HEAT SINK

[75] Inventors: Douglas M. Carlson, Eau Claire; Edward A. Malosh, Chippewa Falls, both of Wis.

[73] Assignee: Cray Research, Inc., Eagan, Minn.

[21] Appl. No.: 08/971,179

[22] Filed: Nov. 17, 1997

[51] Int. Cl.$^7$ .................................................. H05K 7/20
[52] U.S. Cl. .......................... 361/704; 361/702; 361/707; 361/712; 165/80.3; 174/16.3; 257/706
[58] Field of Search ........................... 361/697, 702–710, 361/712, 690, 383; 174/16.3, 41.3; 165/80.3, 80.4, 185, 907, 122, 903; 257/713, 722, 721–726

[56] References Cited

U.S. PATENT DOCUMENTS

| | | | |
|---|---|---|---|
| 3,479,731 | 11/1969 | Mantel et al. | 29/472.3 |
| 3,928,907 | 12/1975 | Chisholm | 29/527.4 |
| 4,843,693 | 7/1989 | Chisholm | 29/157.3 |
| 5,312,508 | 5/1994 | Chisholm | 156/292 |
| 5,358,032 | 10/1994 | Arai et al. | 165/80.3 |
| 5,727,622 | 3/1998 | Gurevich et al. | 165/80.3 |

OTHER PUBLICATIONS

"Serpentine Copper Mesh Forms Heat Sinks", *Electronic Packaging and Production*, Ed. Howard Markstein, 42, (Oct. 1990).

*Primary Examiner*—Leo P. Picard
*Assistant Examiner*—Michael Datskovsky
*Attorney, Agent, or Firm*—Schwegman, Lundberg, Woessner & Kluth, PA

[57] ABSTRACT

A heat sink is disclosed having an elongate, porous metal structure, including multiple sets of thermally conductive members. The members, which are interwoven, direct heat away from a heat producing component. The elongate structure of the matrix structure can be formed in a variety of predetermined forms, including a coiled structure or an elliptically coiled structure. Alternatively, the matrix structure is plated for added thermal conductivity between the sets of members. In addition, air flow is directed over the heat sink for added convection of heat. The heat sink is fabricated using a mesh of thermally conductive material such as copper or aluminum and can be provided with a plurality of protuberances. The heat sink is thermally bonded to the heat producing component. Alternatively, the heat sink has a ledge for sealing with a duct.

A method for cooling a heat producing component is also disclosed. The method includes the steps of providing a heat sink structure as above, thermally coupling the heat sink structure to a heat producing component, and directing a fluid flow over the heat sink structure.

23 Claims, 6 Drawing Sheets

POROUS METAL HEAT SINK

FIELD OF THE INVENTION

The present invention relates generally to heat distribution devices. More particularly, it pertains to a porous heat sink.

BACKGROUND OF THE INVENTION

Computers and other electrical devices continue to decrease in size, yet increase in capabilities. Electronic components, all of which produce varying amounts of heat during operation, are generally housed within a substantially closed compartment for protection from particulate matter and physical damage. The density and heat dissipation of electronic parts has increased steadily over the years. The increased number of parts and their close proximity increases the need for proper cooling.

Heat sinks are generally known in the art. Heat sinks are being designed to dissipate heat conductively or by convection. Some heat sinks include a structure having fins. In a heat sink which operates by conduction, the finned structure is thermally coupled with an electronic component, to aid in reducing the temperature of the component. Another approach is to provide a fan for blowing air over the electronic component. However, these approaches have limited effectiveness.

Another type of existing type of heat sink is formed of aluminum and has a number of heat dispersing fins. The heat sink sometimes is black in color and the power amplifying electronic element is mounted in a hollow or recess formed by a number of the heat dispersing fins. Heat generated by the electronic element is dispersed only by the radiation thereof to the atmosphere from the heat dispersing fins, or the heat is transmitted to the chassis on which the heat sink is mounted. In order to obtain a sufficient heat dispersing effect from some electronic components merely by radiation from the fins, it has been necessary to employ larger heat sinks for providing a large heat dispersing surface. However, by increasing the size of the heat sink, a satisfactory heat dispersing effect cannot always be obtained. Another disadvantage is that the cost of the heat sink is increased with its size. In addition, one particular heat sink may be insufficient to accommodate other electronic devices due to volume or weight restrictions. Also, if heat sinks are necessarily larger, the electronic component spacings are increased, and electrical performance is decreased.

Another heat sink approach is described in U.S. Pat. No. 5,312,508 to Chisholm on May 17, 1994 which discloses attaching a crimped wire mesh to an object requiring heat transfer. According to Chisholm, a corrugated wire mesh having a plurality of wire bends is attached to a substrate. However, Chisholm's does not have a surface or configuration to easily couple with air flow, and therefore does not provide effective heat dissipation where proper air flow is required.

Accordingly, what is needed is a heat sink for efficiently and inexpensively cooling electronic components. What is further needed is a heat sink which is adaptable to a variety of heat dissipation requirements.

SUMMARY OF THE INVENTION

A heat sink is provided for directing heat away from a heat producing component. The heat sink includes an elongate strip of thermally conductive material for connecting with the heat producing component. The material has a porous structure, which may be flexible, and is shaped into a predetermined form factor. In one embodiment, the heat sink is shaped into a coiled structure. In another embodiment, the heat sink is shaped into an elliptical structure. Alternatively, the elongate strip has a cut out for forming a ledge when the heat sink is shaped into the coiled or elliptical structure. The ledge is formed on an outer periphery of the coiled structure.

The elongate strip forming the heat sink comprises a first and second set of thermally conductive members. The first and second set of thermally conductive members are interwoven, and are disposed within a single plane. Within this plane, the members are placed at approximately a ninety degree angle to each other. The first and second set of members are slightly offset from each other, thereby providing increased resistance to air flow thereover. In one embodiment, the first and second set of thermally conductive members are plated, to thermally couple the first and second set of members. The elongate strip is fabricated from metal which may include copper or aluminum.

A system is also disclosed for drawing heat away from a heat producing component where an elongate strip is provided with a porous structure. The elongate strip, having a predetermined form factor, is thermally coupled with a heat producing component. A fluid flow is directed through the heat sink, and the heat is dissipated away from the heat producing component. In one embodiment, the fluid flow comprises air.

A method for cooling a heat producing component is also provided. The method includes providing a heat sink structure, which may be plated. The heat sink structure is formed into a particular form factor, such as a circularly coiled shape. The heat sink structure is bonded to the heat producing component. A flow of fluid, such as air, is directed through the heat sink structure.

The provided heat sink is an inexpensive way to cool electronic components. Another advantage is the heat sink is light weight, which is a serious concern for manufacturers of conventional electronic products. Additionally, the heat sink can be manipulated to accommodate various restrictions such as volume or weight.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. Therefore, the following detailed description is not to be taken in a limiting sense, and the scope of the present invention is defined by the appended claims.

Figure 1A:
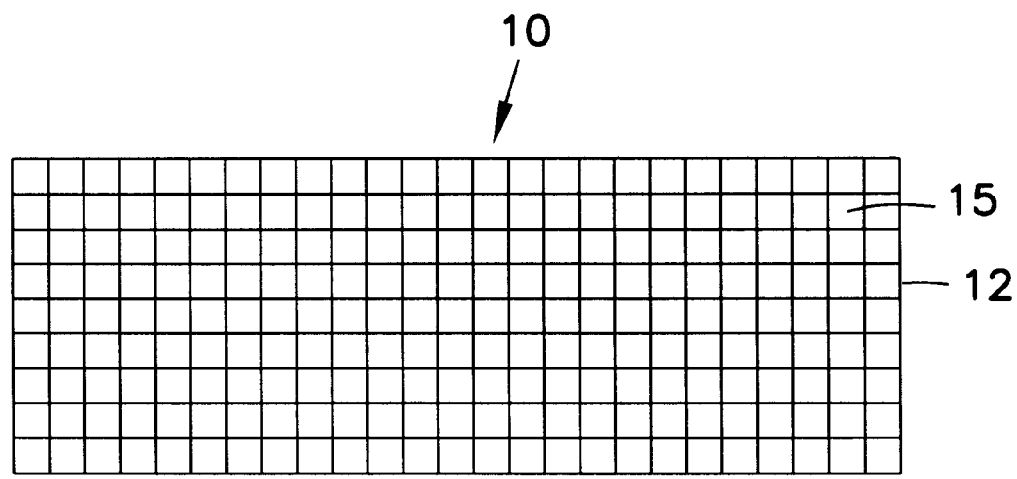
FIG. 1A is a first side elevational view illustrating a heat sink constructed in accordance with one embodiment of the present invention.
Figure 1B:
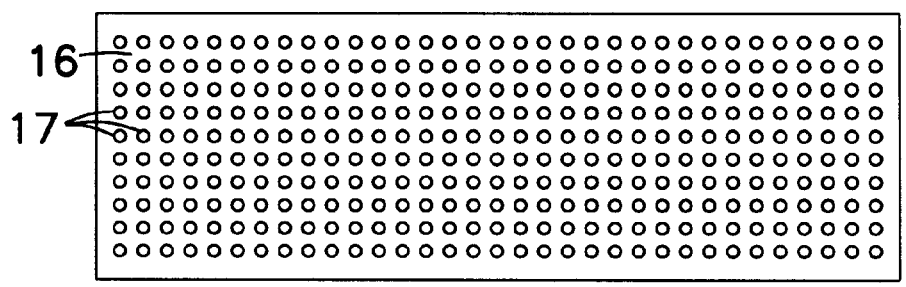
FIG. 1B is a first side elevational view illustrating a heat sink constructed in accordance with one embodiment of the present invention.

As illustrated in Figure 1A in one embodiment, a heat sink 10 is provided having an elongate structure 12. The heat sink 10 has a generally rectangular shape before it is formed, although other shapes are contemplated within the scope of the invention. In one embodiment, the elongate structure 12 comprises a metal matrix. The metal matrix of the elongate structure 12 includes a plurality of apertures 15 therein, thereby creating a porous structure. The apertures 15 are shown as having a square shape. However, the apertures 15 could include other shapes such as circles or diamonds, or any equivalent. In one embodiment, a mesh screen is used to form the elongate porous structure, although other porous structures could be used for the heat sink 10. Alternatively, a porous metal sheet could be used, as shown in FIG. 1B. The porous metal sheet 16 has a plurality of apertures 17 stamped or otherwise formed therein. The apertures 17 are circular, although the apertures could be formed in other shapes such as squares or triangles, or any equivalent.

The elongate structure 12 is fabricated from a porous, metal sheet of material. The material should have sufficient thermal conductivity, such as copper or aluminum to transfer heat away from a heat producing component. In addition, in one embodiment, the material is flexible, thereby permitting the elongate structure 12 to be manipulated and shaped into a variety of form factors. The width and length of the elongate structure 12 depends on the particular application of the heat sink 10, and can be modified accordingly. If increased heat dissipation is required, a larger elongate structure 12 is provided. However, the total amount of material may be further adjusted in light of weight or volume constraints.

Figure 2A:
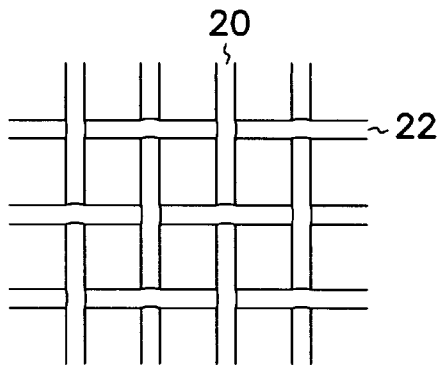
FIG. 2A is an enlarged first side elevational view illustrating a heat sink constructed in accordance with one embodiment of the present invention.

As shown in FIG. 2A, in one embodiment, the heat sink 10 includes a first and a second set of thermally conductive members 20, 22. Each of the first and second set of thermally conductive members 20, 22 is generally comprised of an elongate cylinder, although other cross sections, such as square or triangular shapes are considered within the scope of the invention. Each of the first and second set of members 20, 22 is generally parallel to each other, respectively. The individual members are also substantially disposed within the same plane before formation into a particular form factor. In one embodiment, the first set of conductive members 20 is woven with the second set of conductive members 22, thereby creating a mesh or a screen.

Figure 2B:
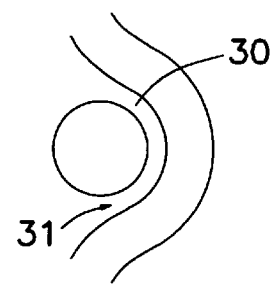
FIG. 2B is an enlarged second side elevational view illustrating a heat sink constructed in accordance with one embodiment of the present invention.
Figure 4A:
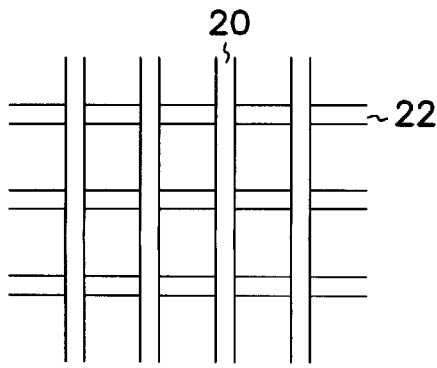
FIG. 4A is a is an enlarged first side elevational view illustrating a heat sink constructed in accordance with another embodiment of the present invention.
Figure 4B:
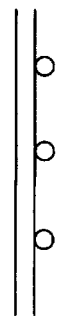
FIG. 4B is an enlarged second side elevational view illustrating a heat sink constructed in accordance with another embodiment of the present invention.

The interweaving of the first and second set of conductive members 20, 22 creates an offset 30, as shown in FIG. 2B. The offset 30 creates a gap 31 between the first and second set of conductive members 20, 22. The gap 31 allows for air to flow between the conductive members 20, 22. The offset 30 beneficially provides increased resistance to a flow of air directed through the heat sink. The resistance allows for an increased rate of heat dissipation from the heat sink to the environment. The first and second set of conductive members 20, 22 contact each other due to the interweaving of the members 20, 22. The proximate placement of the members 20, 22 allows for heat to be transferred from one set of members to the other, or from one or both sets of members into the air. In another embodiment, as shown in FIGS. 4A and 4B, the first and second set of conductive members 20, 22 are disposed proximate to one another, but are not interwoven. The first and second set of conductive members 20, 22 are secured to each other using a thermally conductive material, and may be angled at approximately a ninety degree angle with respect to each other.

Figure 3A:
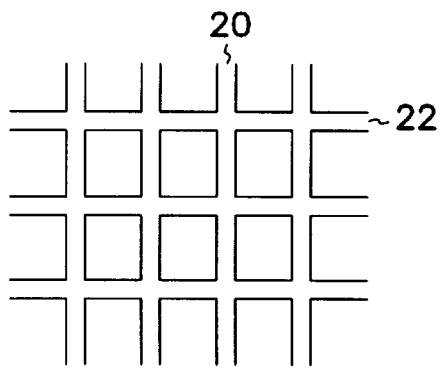
FIG. 3A is an enlarged first side elevational view illustrating a heat sink constructed in accordance with another embodiment of the present invention.
Figure 3B:
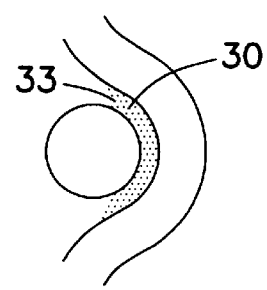
FIG. 3B is an enlarged second side elevational view illustrating a heat sink constructed in accordance with another embodiment of the present invention.

Alternatively, the elongate structure 12 can be plated. The elongate structure 12 can be electroplated, using a variety of plating materials, such as chromium, nickel, copper, zinc, tin, or other materials. As shown in FIG. 3A, the plating of the elongate structure 12 thermally couples the first set of conductive members 20 with the second set of conductive members 22. FIG. 3B illustrates the physical effect of plating the elongate structure 12. The first set of conductive member 20 are offset from the second set of conductive members 22, however, the plating displaces the gap 31 (FIG. 2B) of the offset. Material 33 displacing the gap 31 thermally couples the first and second set of conductive members 20, 22, which promotes increased thermal conductivity throughout the heat sink 10. Although plating the elongate structure 12 has been described herein, other types of coating processes supplying a thermally conductive coating could be used to substantially displace the gaps 31 with material, and yet remain within the scope of the present invention. For instance, the elongate structure 12 can be coated with thermally conductive materials such as thermal epoxy or thermal grease.

The heat sink 10 may also be provided in a multitude of form factors. Form factors permit increased surface area for the heat sink in the same or smaller amounts of space, which promotes increased heat dissipation from the heat sink. Further, the various form factors allow increased flexibility in accommodating the changing needs of multiple environments, including amount of heat dissipation, and available volume for the heat sink.

Figure 5:
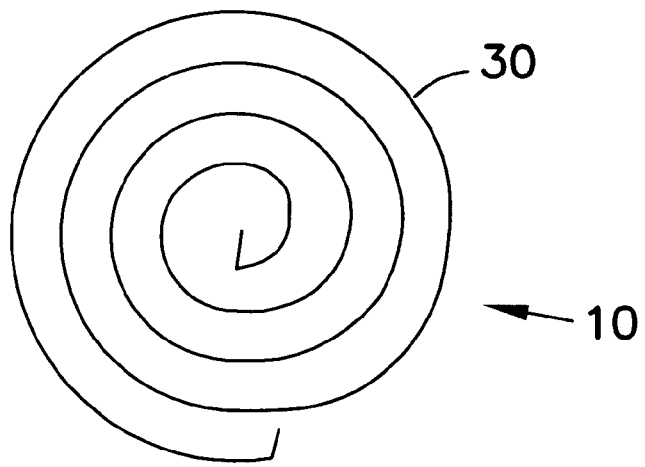
FIG. 5 is a top plan view illustrating a heat sink formed in a coiled form factor constructed in accordance with another embodiment of the present invention.

In one embodiment as illustrated in FIG. 5, the heat sink 10 is formed in a coiled, circular structure 30. The elongate structure 12 is rolled starting from one edge. An edge portion of the elongate structure 12 is formed around a round mandrel, and then the elongate structure 12 curled around itself to form the coiled, circular structure. Alternatively, the heat sink 10 is connected to the heat producing component at one edge, and then coiled around the heat producing component. The heat sink 10, using the coiled structure 30 form factor, allows for effective heat dissipation without adding significant weight to the electronic component assembly being cooled.

Figure 6:
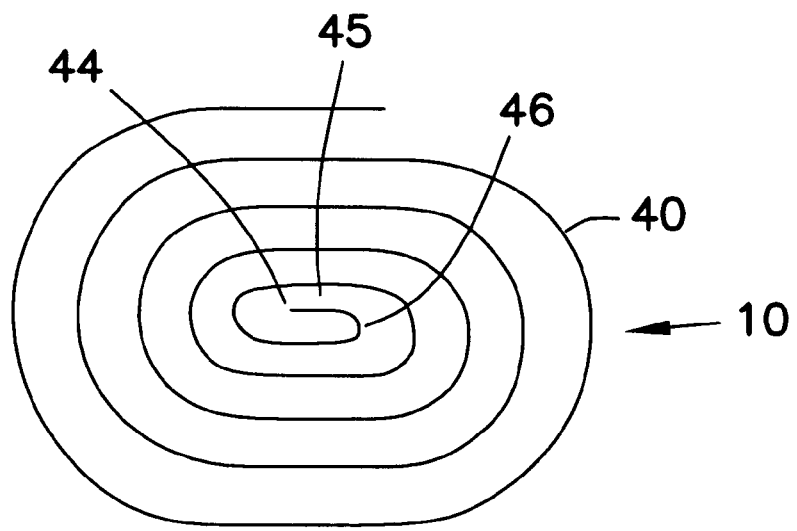
FIG. 6 is top plan view illustrating a heat sink formed in a folded form factor constructed in accordance with yet another embodiment of the present invention.

Another form factor is shown in FIG. 6. In this embodiment, the heat sink 10 is formed in a coiled, elliptical structure 40. To create the elliptical structure 40, the elongate structure 12 is held at a first end 44. The elongate structure 12 is folded at fold 46 to form a flat 45. In one embodiment, the flat 45 is approximately 114 inch wide. The elongate structure 12 is then folded and rolled around the flat 45 to create the elliptical structure 40. The elliptical structure 40 has two sides which are generally flat, which allows heat sinks to be placed closer together while still covering square or rectangular chips. Further, the flexible nature of the elongate structure 12 allows the heat sink 10 shown to be adjusted as necessary. For instance, if a smaller volume of space is available for the heat sink 10, the elliptical structure 40 may be folded tighter, thereby decreasing the necessary volume of space for the heat sink 10.

Figure 7A:
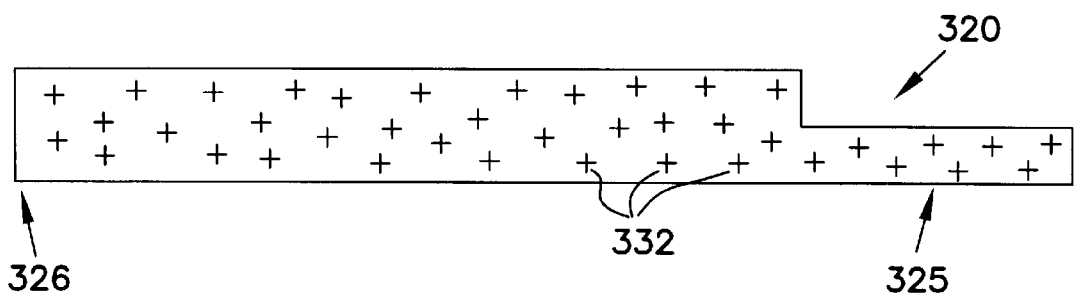
FIG. 7A is a first side elevational view illustrating a heat sink constructed in accordance with one embodiment of the present invention.
Figure 7B:
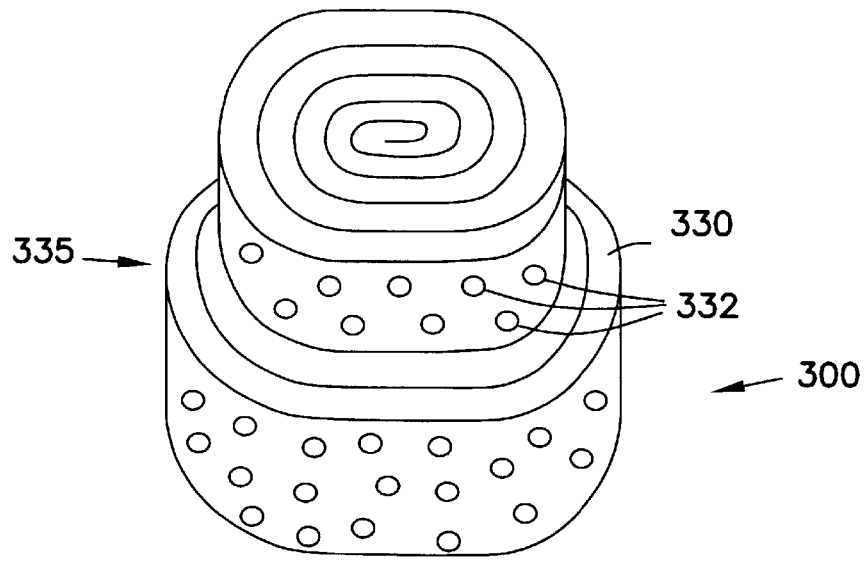
FIG. 7B is a perspective view illustrating a heat sink constructed in accordance with another embodiment of the present invention.

Another embodiment is shown in FIGS. 7A and 7B. A heat sink 300 is provided having an elongate structure 312. In one embodiment, the elongate structure 312 comprises a metal matrix. The metal matrix of the elongate structure 312 includes a plurality of apertures (not shown) therein, thereby creating a porous structure. The apertures have a circular shape, however, the apertures could include other shapes such as squares or diamonds, or any equivalent. In one embodiment, a mesh screen is used to form the elongate porous structure 312, although other porous structures could be used for the heat sink 300.

The elongate structure 312 is fabricated from a porous, metal sheet of material. The material should have sufficient thermal conductivity, such as copper or aluminum to transfer heat away from a heat producing component. In addition, in one embodiment, the material is flexible, thereby permitting the elongate structure 312 to be manipulated and shaped into a variety of form factors, as discussed above. The width and length of the elongate structure 312 depends on the particular application of the heat sink 300, and can be modified accordingly. If increased heat dissipation is required, a larger elongate structure 312 is provided. However, the total amount of material may be further adjusted in light of weight or volume constraints.

In one embodiment, the heat sink 300 has a generally rectangular shape before it is formed, and has a cut out 320 therein. The cut out 320 is generally rectangularly shaped, and is positioned such that is longitudinally aligned with the elongate structure 312. The cut out 320 is for forming a ledge 330 around the heat sink 300 at an outer periphery surface, as shown in FIG. 7B. The cut out 320 is disposed proximate a second end 325 of the heat sink 300. The heat sink 300 is then coiled around a first end 326 such that the ledge 330 is disposed on the periphery of the heat sink 300. In one embodiment, the cut out 320 is sized such that the ledge 330 is approximately at a midpoint 335 of the heat sink 300.

The ledge 330 provides a mounting surface for a sealed plenum chamber, as discussed below, which is used to push or pull a fluid through the heat sink 300. Alternatively, in another embodiment, the sealed plenum chamber can be sealed against the ledge 330 with an O-ring, gasket, or other sealing members. The ledge 330 allows for creating a point of contact to the heat sink such that there is a pressure difference above and below the sealing ledge 330.

FIGS. 7A and 7B also illustrate another embodiment of the heat sink 300. A plurality of protuberances 332 are formed in the elongate strip 312. In one embodiment, the protuberances 332 are formed in an array pattern by hammering the elongate strip 312. The protuberances 332 can be formed by using a tool to deform the elongate strip 312. For instance, an aluminum bar is machined to form posts onto one surface of the bar. The tool is then placed on a surface of the elongate strip and pressed down onto the strip. The posts of the tool deform the elongate strip leaving a protuberance on the elongate strip 312 of a predetermined depth. The protuberances 332 serve as spacers as the elongate strip 210 is formed into the coiled structure, thereby uniformly controlling gaps through which air flows.

Figure 8:
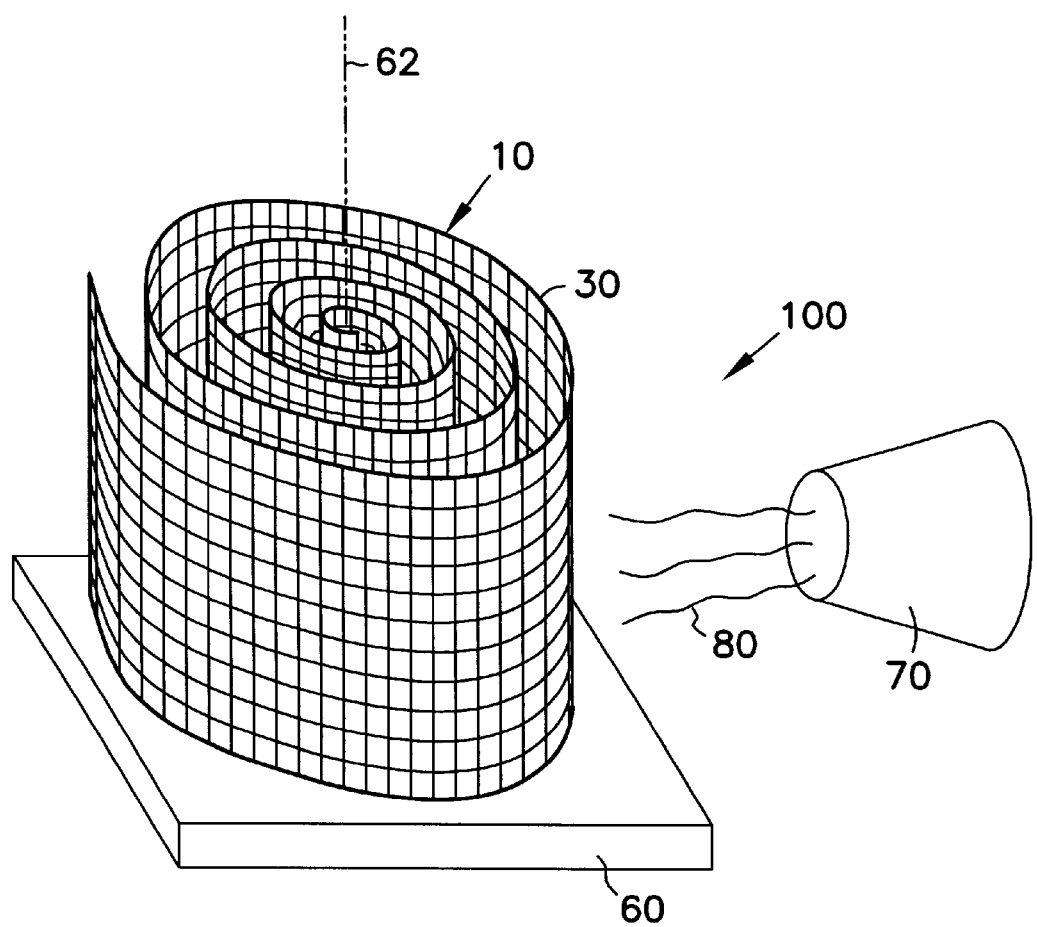
FIG. 8 is a perspective view illustrating a heat sink bonded to a heat producing component constructed in accordance with another embodiment of the present invention.

In another embodiment, the heat sink 10 is thermally coupled with a heat producing component 60, as illustrated in FIG. 8. In one embodiment, a radial axis 62 of the coiled structure 30 is substantially perpendicular to the heat producing component 60. In another embodiment, the radial axis 62 is substantially parallel to the heat producing component 60. The heat sink 10 can be bonded to the heat producing component 60, or thermally coupled in other equivalent manners. The thermal coupling may be made using any variety of thermally conductive material known to those skilled in the art, including thermally conductive epoxy, thermal grease, or oil. Heat from the heat producing component 60 flows through the thermally conductive material into the heat sink, and then is carried away from the heat sink 10 by either air or liquid. Air 80 is directed through the heat sink 10, transverse to the radial axis 62. Alternatively, air 80 is pushed or pulled through the heat sink 10 along the radial axis 62.

Figure 9:
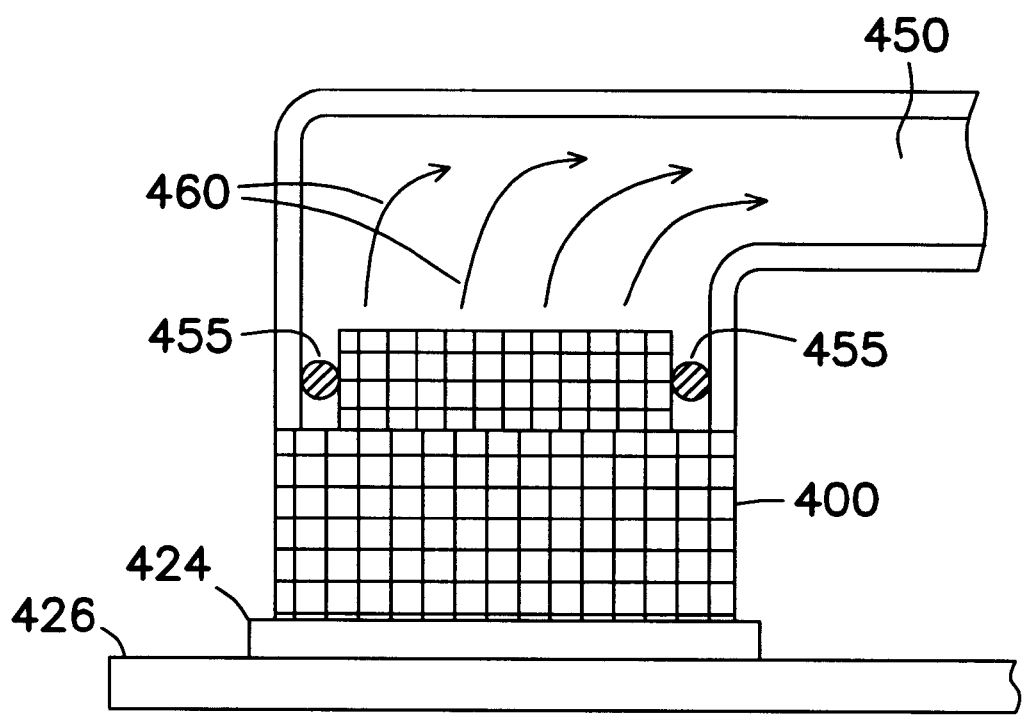
FIG. 9 is a perspective view illustrating a heat sink bonded to a heat producing component constructed in accordance with yet another embodiment of the present invention.

In another embodiment as shown in FIG. 9, a heat sink 400 is shown mounted to a chip 424, which is mounted to a substrate 426. A duct 450 is coupled with the heat sink 400 at a ledge 420. In one embodiment, the duct 450 is sealed with the ledge 420 with a gasket 455. The gasket 455, for instance, comprises an 0-ring disposed about the heat sink 400. Fluid 460, such as air, can be pushed or pulled axially up or down a core of the heat sink 400 with air entering or exiting through outer edges of the coil to cool the chip 424.

Referring again to FIG. 8, a system 100 for cooling the heat producing component 60 includes a device 70 for providing air flow 80. The air flow 80 is directed over or through heat sink 10, which dissipates the heat collected within the heat sink 10. In one embodiment, the air flow 80 is directed transversely over the heat sink 10. Although heat sink 10 is shown, the system 100 could also incorporate the heat sink 110 of FIG. 9. Air flow 80 is discussed herein, however, other types of cooling fluids and gases are appropriate for aiding in the dissipation of heat from the heat sink 10. As a result of the heat dissipation from the heat sink 10, more heat is then conducted away from the heat producing component 60 to the heat sink 10, which is then dissipated, in part, by the air flow 80.

Advantageously, the heat sink is light weight due to the porous nature of the material and the density of the materials used. In addition, the designs discussed above provide for low manufacturing costs. The copper material used for the heat sink in one embodiment allows for high thermal conductivity. However, aluminum is a less expensive and lighter alternative. The offsets of the mesh structure enhance the flow pattern and yield a higher thermal transfer from the heat producing component. Plating the mesh structure provides for increased heat transfer between the individual members of the mesh structure. The heat sink is also flexible so that when bonded to silicon chips, the difference in the thermal coefficient of expansion between the copper and the silicon becomes inconsequential, and therefore does not require special adhesives and adhesive thicknesses otherwise necessary.

The heat sink is easily adjustable and can be manipulated to provide proper heat dissipation for a particular heat producing component by merely adjusting the tightness and the shape of the mesh. Loosely formed coiled heat sinks will have gaps between the revolutions of the coils that are larger than very tightly wound coils. The larger gaps will result in less pressure being required to push a given volumetric flow rate. The protuberances of the heat sink allow for increase adjustability of the heat sink since specifically sized gaps can be created depending on the application.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A heat sink for directing heat away from a heat producing component, the heat sink comprising:
    an elongate strip of thermally conductive material having a porous structure, said elongate strip for thermally connecting with a heat producing component; and
    said elongate strip having a predetermined form factor, said predetermined form factor comprising a coiled structure, wherein the heat sink has an outer periphery surface, the outer periphery surface has a cut out therein, the cut out for forming a ledge.

2. The heat sink as recited in claim 1, wherein the coiled structure includes an elliptical structure.

3. The heat sink as recited in claim 1, wherein the coiled structure is mounted in thermal contact with the heat producing component.

4. The heat sink as recited in claim 1, wherein the porous structure comprises a first set of thermally conductive members and a second set of thermally conductive members.

5. The heat sink as recited in claim 4, wherein said first set of thermally conductive members are interwoven with said second set of thermally conductive members.

6. The heat sink as recited in claim 4, wherein the first and second set of thermally conductive members are substantially cylindrical.

7. The heat sink as recited in claim 4, wherein the first set of thermally conductive members are offset from said second set of thermally conductive members.

8. The heat sink as recited in claim 4, wherein the first set of thermally conductive members are disposed substantially within the same plane as the second set of thermally conductive members.

9. The heat sink as recited in claim 8, wherein the first set of members are disposed at approximately a ninety degree angle from said second set of members.

10. The heat sink as recited in claim 4, wherein the porous structure is coated with a coating of thermally conductive material, whereby the first set of members are thermally coupled with said second set of members.

11. The heat sink as recited in claim 4, wherein the first and second set of thermally conductive members are plated with thermally conductive material.

12. The heat sink as recited in claim 1, wherein the elongate strip includes metallic material.

13. The heat sink as recited in claim 12, wherein the elongate strip includes copper.

14. The heat sink as recited in claim 12, wherein the elongate strip includes aluminum.

15. The heat sink as recited in claim 1, wherein the elongate strip is flexible.

16. A heat sink for directing heat away from a heat producing component, the heat sink comprising:
    an elongate strip of thermally conductive material having a porous structure and a plurality of protuberances thereon, said elongate strip for thermally connecting with a heat producing component;
    said elongate strip having a predetermined form factor; said predetermined form factor comprising a coiled structure; and
    wherein the heat sink has an outer periphery surface, the outer periphery surface has a cut out therein, the cut out for forming a ledge.

17. A system for directing heat away from a heat producing component, the system comprising:
    an elongate strip of thermally conductive material having a porous structure, said elongate strip for thermally coupling with a heat producing component;
    said elongate strip having a coiled form factor;
    a structure for directing a fluid flow through the elongate strip; and wherein the coiled form factor has a radial axis and the fluid directing structure directs the fluid flow along the radial axis of the coiled form factor.

18. The system as recited in claim 17, wherein the coiled form factor comprises an elliptical coiled structure.

19. The system as recited in claim 17, wherein the coiled structure is mounted in thermal contact with the heat producing component.

20. The method for cooling a heat producing component as recited in claim 17, wherein the step of providing an elongate strip includes plating the heat sink structure with thermally conductive material.

21. The method for cooling a heat producing component as recited in claim 17, wherein the step of thermally coupling the coiled form factor to the heat producing component includes bonding the coiled form factor to the heat producing component.

22. A method for cooling a heat producing component, the method comprising the steps of:
    providing an elongate strip of porous thermally conductive material;
    forming a plurality of protuberances on the strip of porous thermally conductive material;
    forming a cut out in the strip of porous thermally conductive material thereby creating a ledge;
    forming said elongate strip into a coiled form factor;
    coupling a plenum with the ledge;
    thermally coupling the coiled form factor to the heat producing component; and
    directing a fluid flow through the heat sink structure thereby cooling the heat producing component.

23. The method for cooling as recited in claim 22, wherein the step of coupling a plenum with the ledge includes the step of sealing the plenum against the ledge with a sealing member.

\* \* \* \* \*